(12) United States Patent
Waks et al.

(10) Patent No.: US 12,525,927 B2
(45) Date of Patent: Jan. 13, 2026

(54) PHASE SHIFTER WITH CONTROLLABLE ATTENUATION AND METHOD FOR CONTROLLING SAME

(71) Applicant: NXP B.V., Eindhoven (NL)

(72) Inventors: Adam Erik Waks, Caen (FR); Olivier Tesson, Bretteville l'Orgueilleuse (FR); Olivier Crand, Parfouru sur Odon (FR)

(73) Assignee: NXP B.V., Eindhoven (NL)

( * ) Notice: Subject to any disclaimer, the term of this patent is extended or adjusted under 35 U.S.C. 154(b) by 538 days.

(21) Appl. No.: 18/056,767

(22) Filed: Nov. 18, 2022

(65) Prior Publication Data
US 2023/0170851 A1  Jun. 1, 2023

(30) Foreign Application Priority Data
Dec. 1, 2021  (EP) .................................... 21306675

(51) Int. Cl.
*H03F 1/32*   (2006.01)
*H03H 11/20*  (2006.01)

(52) U.S. Cl.
CPC ........... *H03F 1/3247* (2013.01); *H03H 11/20* (2013.01); *H03F 2200/451* (2013.01)

(58) Field of Classification Search
CPC .. H03F 1/3247; H03F 2200/451; H03H 11/20
USPC ........................................................ 330/149
See application file for complete search history.

(56) References Cited

U.S. PATENT DOCUMENTS

| | | | |
|---|---|---|---|
| 6,850,130 B1 * | 2/2005 | Gottl ......................... | H01Q 3/32 |
| | | | 333/156 |
| 9,503,024 B2 * | 11/2016 | Aoki ......................... | H03F 3/72 |
| 9,634,650 B2 * | 4/2017 | Allison ..................... | H03H 7/20 |
| 10,291,282 B1 * | 5/2019 | Lin ........................... | H04B 1/52 |
| 10,530,320 B2 * | 1/2020 | Sharma ..................... | H03H 7/06 |
| 10,680,581 B2 * | 6/2020 | Valdes Garcia ........ | H01P 1/127 |
| 2013/0194017 A1 * | 8/2013 | Staudinger ............ | H03F 1/3282 |
| | | | 327/231 |
| 2016/0380623 A1 * | 12/2016 | Allison ..................... | H03H 7/25 |
| | | | 327/237 |
| 2018/0019721 A1 | 1/2018 | Sharma | |

(Continued)

OTHER PUBLICATIONS

Michael Steer, 3.8: Co-Planar Waveguide, North Carolina State University, https://eng.libretexts.org (Year: 2017).*

(Continued)

*Primary Examiner* — Hafizur Rahman

(57) ABSTRACT

A phase shifter (100) with controllable attenuation and a method for controlling the phase shifter is disclosed, the phase shifter (100) comprising a plurality of transmission line segments (120, 220) coupled in series, wherein each said transmission line segment (120, 220) comprises an attenuation circuit (130, 230), selectively couplable between a signal line (126, 222) of the transmission line segment (120, 220) and ground to selectively attenuate a signal propagating through the transmission line segment (120, 220). Each transmission line segment (120, 220) is switchable between a first configuration providing a first phase shift for a signal propagating through the transmission line segment (120, 220) and a second configuration providing a second phase shift, greater than said first phase shift, for a signal propagating through the transmission line segment (120, 220).

13 Claims, 4 Drawing Sheets

(56) References Cited

U.S. PATENT DOCUMENTS

2018/0302063 A1    10/2018  Grelaud et al.
2019/0158068 A1     5/2019  Garcia et al.
2019/0158069 A1*    5/2019  Grelaud ............... H04B 1/0458

OTHER PUBLICATIONS

Tousi, Y., "A Ka-band Digitally-Controlled Phase Shifter with sub-degree Phase Precision", 2016 IEEE Radio Frequency Integrated Circuits Conference (RFIC), May 22-24, 2016.
Woods, W.H., "CMOS Millimeter Wave Phase Shifter Based on Tunable Transmission Lines", Proceedings of the IEEE 2013 Custom Integrated Circuits Conference, Sep. 22-25, 2013.

* cited by examiner 220
phase shift: OFF (low)
attenuation: ON (high)

220
phase shift: ON (high)
attenuation: ON (high)

PHASE SHIFTER WITH CONTROLLABLE ATTENUATION AND METHOD FOR CONTROLLING SAME

CROSS-REFERENCE TO RELATED APPLICATIONS

This application claims the priority under 35 U.S.C. § 119 of European Patent application no. 21306675.6, filed on 1 Dec. 2021, the contents of which are incorporated by reference herein.

FIELD OF THE DISCLOSURE

The present disclosure relates to a phase shifter with controllable attenuation and a method for controlling the phase shifter. In particular, but not exclusively, it relates to a passive phase shifter with controllable phase shift and built-in controllable attenuation.

BACKGROUND OF THE DISCLOSURE

A passive digitally-controllable phase shifter based on Transmission Line (TL) can be realized by changing the time constant of each unity segment constituting the TL. These TL-type phase shifters are used in beam-forming architecture for 5G NR (New Radio) applications.

When amplitude tapering an array antenna, accurate and high-resolution amplitude control is crucial. In 5G mm-wave beam-forming architectures, this is often achieved by a Variable Gain Amplifier (VGA) or a controllable attenuator. An attenuator is associated with unwanted insertion loss, while a VGA is an active current-consuming device increasing power consumption. Both attenuator and VGA occupy overhead area, leading to a more complex floorplan.

SUMMARY OF THE DISCLOSURE

Aspects of the disclosure are set out in the accompanying claims. Combinations of features from the dependent claims may be combined with features of the independent claims as appropriate and not merely as explicitly set out in the claims.

According to an aspect of the disclosure, there is provided a phase shifter comprising a plurality of transmission line segments coupled in series, wherein each said transmission line segment comprises:
  an attenuation circuit, selectively couplable between a signal line of the transmission line segment and ground to selectively attenuate a signal propagating through the transmission line segment By providing an attenuation step in each one of the plurality of transmission line segments, attenuation per unit segment may be small and the phase shifter is able to function as an attenuator with excellent linearity and minimal dispersion and minimal impact on $S_{11}$. As the attenuator is integrated into the phase shifter, there is no additional area overhead and minimal insertion loss when compared with a conventional attenuator. Since the phase shifter is a passive device, power consumption is reduced compared with use of a variable gain amplifier.

At least one said transmission line segment may be switchable between a first configuration providing a first phase shift for a signal propagating through the transmission line segment and a second configuration providing a second phase shift, greater than said first phase shift, for a signal propagating through the transmission line segment.

Thus each transmission line segment may selectively provide a phase shift and may selectively provide an attenuation, controllable independently of the phase shift.

The attenuation circuit may be selectively configurable between a first configuration providing a first resistance between the signal line and ground and a second configuration providing a second resistance, different from said first resistance, between the signal line and ground.

Advantageously, this enables the attenuation circuit, when coupled, to provide a different loss dependent on other parameters of the phase shifter, for example to compensate other losses in the transmission line segment thereby minimising phase-to-gain.

The phase shifter may be configured such that said first configuration of said attenuation circuit is selected for attenuating a signal when said transmission line segment is configured for providing said first phase shift; and said second configuration of said attenuation circuit is selected for attenuating a signal when said transmission line segment is configured for providing said second phase shift.

The attenuation circuit may comprise a first switching element for selectively coupling the attenuation circuit between the signal line and ground.

In some embodiments, the first switching element may also provide an intrinsic resistance thereby providing a resistive loss for attenuating the signal without requiring any additional resistive element. In other embodiments, the attenuation circuit may comprise one or more additional resistive elements.

The attenuation circuit may further comprise at least:
  a resistive element coupled in series with the first switching element;
  a second switching element for selectively bypassing the resistive element.

By selectively bypassing the resistive element, the resistance between the signal line and ground may be changed, for example to provide said first and second resistances.

Said first resistance may be provided at least in part by said resistive element and an other resistive element, said other resistive element optionally corresponding to an internal resistance of said first switching element.

Said second resistance may be provided at least in part by an internal resistance of said first switching element.

Each said transmission line segment may comprise a first capacitance selectively couplable between a signal line of the transmission line segment and ground for compensating a capacitance of the attenuation circuit.

The phase shifter may be configured such that said first capacitance is coupled between the signal line and ground when the attenuation circuit is not coupled between the signal line and ground.

In this way, the capacitance of the transmission line segment when the attenuation circuit is in use (i.e. coupled between the signal line and ground) may be equalised with the capacitance of the transmission line segment when the attenuation circuit is not in use.

Said at least one transmission line segment may comprise a second capacitance selectively couplable between a signal line of the transmission line segment and ground for compensating a difference in capacitance of the transmission line segment between the first configuration of the transmission line segment and the second configuration of the transmission line segment.

Said second capacitance may be coupled between the signal line and ground when the transmission line segment is in its second configuration. Said second capacitance may be uncoupled when the transmission line segment is in its first configuration.

Each said transmission line segment may be a segment of a coplanar waveguide transmission line.

Each said transmission line segment may comprise:
a central conductor providing at least a portion of said signal line;
first and second inner conductors parallel to the central conductor, and arranged on opposite sides of the central conductor, selectively couplable to ground to provide an inner return path; and
first and second outer conductors parallel to the central conductor and arranged on opposite sides of the central conductor, providing an outer return path, wherein a spacing of said first and second outer conductors from the central conductor is greater than a spacing of said first and second inner conductors from the central conductor;
wherein, in said first configuration of said transmission line segment, said inner conductors are coupled to ground, providing said first phase shift for a signal propagating through the transmission line segment;
wherein, in said second configuration, said inner conductors are not coupled to ground, wherein said outer conductors are coupled to ground, providing a second phase shift, greater than said first phase shift, for a signal propagating through the transmission line segment.

The first switching element, second switching element, first capacitance, second capacitance and/or resistive element may be located within an area between the outer conductors, optionally in a layer or layers below the central conductor, inner conductors and/or outer conductors.

Advantageously, the attenuation function of the phase shifter may be implemented without increasing the area of the phase shifter.

The ground reference of the phase shifter may comprise a ground plane.

The phase shifter may further comprise a controller configured to receive an input specifying a required attenuation of the phase shifter, and further configured to output at least one control signal for each transmission line segment of the phase shifter, for controlling said selective coupling of each respective attenuation circuit in dependence on the required attenuation.

Thus the attenuation provided by the phase shifter may be digitally controlled. In particular, the attenuation provided by the phase shifter may be controlled independently of the phase shift provided by the phase shifter.

The phase shifter may further comprise memory storing a plurality of attenuation states and/or phase states of the phase shifter in association with a plurality of corresponding states of the attenuation circuits of the respective transmission line segments and/or configurations of the respective transmission line segments, wherein the digital controller is configured, in response to receiving a required attenuation, to determine the corresponding states of the attenuation circuits by reference to said memory, and to output said respective control signals in accordance with the determination.

This may reduce the complexity of the phase shifter by avoiding or reducing the requirement for compensation of Phase-to-Gain and Gain-to-Phase at the level of individual transmission line segments, thereby reducing insertion losses. Said states of said attenuation circuits may correspond to states of said first switching elements Said plurality of attenuation states and/or phase states of the phase shifter and said plurality of corresponding states of the attenuation circuits and/or configurations of the transmission line segments may be stored as a look up table.

According to another aspect of the disclosure, there is provided a method for controlling an attenuation of a phase shifter, the phase shifter comprising a plurality of transmission line segments coupled in series, the method comprising:
for each transmission line segment of the plurality of transmission line segments, selectively coupling an attenuation circuit between a signal line of at least one transmission line segment and ground to selectively attenuate a signal propagating through the transmission line segment.

The method may further comprise:
for each transmission line segment of the plurality of transmission line segments, selecting between a first configuration of the transmission line segment providing a first phase shift for the signal and a second configuration of the transmission line segment providing a second phase shift for the signal, greater than said first phase shift.

The method may further comprise:
for each transmission line segment of the plurality of transmission line segments, selecting between a first configuration of the attenuation circuit providing a first resistance between the signal line and ground and a second configuration of the attenuation circuit providing a second resistance, different from said first resistance, between the signal line and ground.

BRIEF DESCRIPTION OF THE DRAWINGS

Example embodiments of the present disclosure will be described, by way of example only, with reference to the accompanying drawings in which like reference signs relate to like elements and in which:

FIGS. 4A to 4D schematically illustrate a single transmission line segment of the phase shifter in accordance with an embodiment of the present disclosure, in the following four configurations: A) phase shift off, attenuation off; B) phase shift on, attenuation off; C) phase shift off, attenuation on; and D) phase shift on, attenuation on.

DETAILED DESCRIPTION

Figure 1:
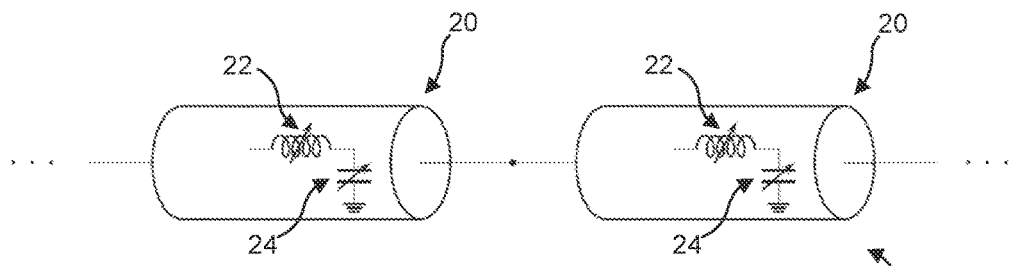
FIG. 1 schematically illustrates a transmission line phase shifter.

FIG. 1 schematically illustrates a controllable transmission line phase shifter 10, in which multiple transmission line segments 20 are connected in series. Each segment 20 is represented by a controllable inductance 22 connected between an input and output of the segment 20, the output of the segment 20 being connected to the input of the next segment 20 of the phase shifter 10, and a controllable capacitance 24 connected between the output of the segment 20 and a ground potential. The characteristic impedance of the transmission line segment 20 is $Z_0=\sqrt{(L'/C')}$ where $L'$ is the value of the inductance 22 and $C'$ is the value of the capacitance 24. The phase shift of a signal propagating through the transmission line segment 20 is $\Delta\Phi=\sqrt{(L'\cdot C')}$.

Figure 2:
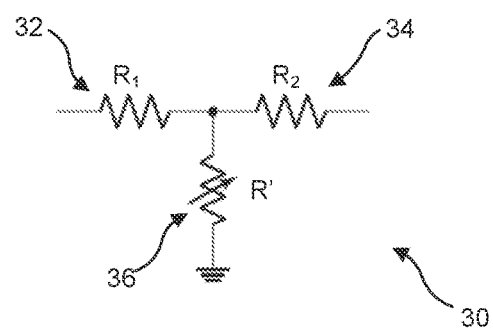
FIG. 2 schematically illustrates a T-attenuator.

FIG. 2 schematically illustrates a T-attenuator 30, comprising two series-connected resistances 32 and 34 and a controllable resistance 36 connected between the common node of the two resistances 32, 34 and a ground potential. In an impedance domain of 50Ω with $R_1 \approx 0$ and $R_2 \approx 0$ the attenuation for small values of R' is A=20 log(1+50/R'), where R' is the value of the controllable resistance 36, with minimal impact on the characteristic impedance.

Figure 3:
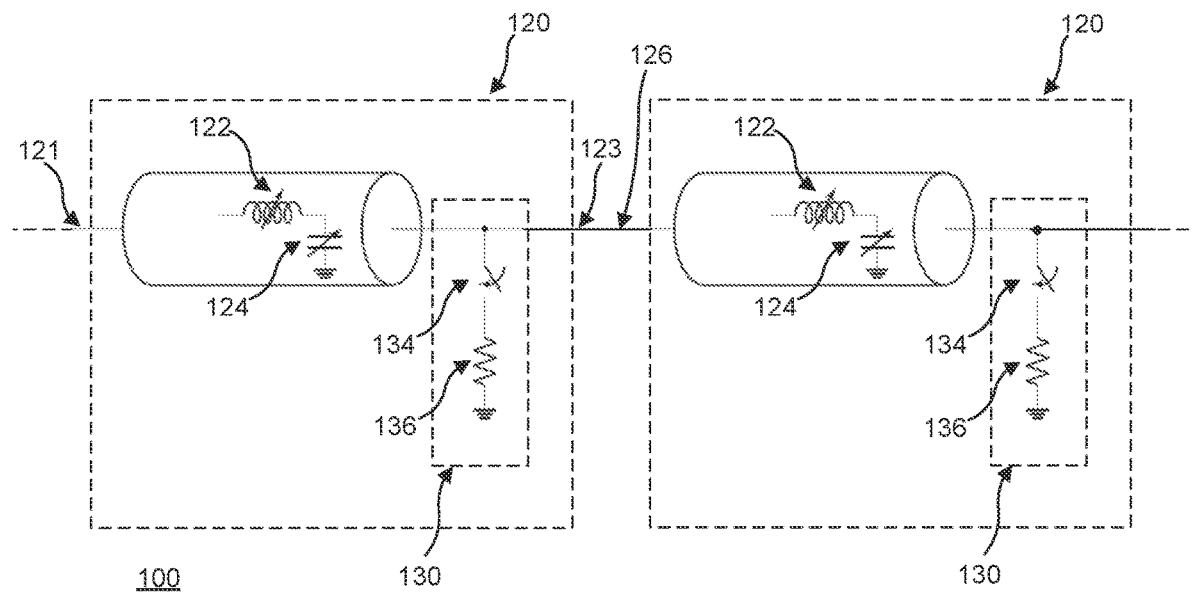
FIG. 3 schematically illustrates a transmission line phase shifter with distributed attenuation in accordance with an embodiment of the present disclosure.

FIG. 3 schematically illustrates a transmission line phase shifter 100 with distributed attenuation in accordance with an embodiment of the present disclosure. The phase shifter 100 comprises a plurality of transmission line segments 120 connected in series. Each segment 120 is represented by a controllable inductance 122 coupled in series with a signal line 126 of the transmission line phase shifter 100, between an input 121 and output 123 of the segment 120, and a controllable capacitance 124 coupled between the signal line 126 and a ground potential. The output 123 of one segment 120 is connected to the input 121 of the next segment 120 in the series.

In addition, each segment 120 includes an attenuation circuit 130, selectively couplable between the signal line 126 of the transmission line segment 120 and the ground potential, to selectively attenuate a signal propagating through the transmission line segment 120. Each attenuation circuit 130 comprises a first switch 134 and a resistance 136, coupled in series between the signal line 126 and the ground potential. The phase shift and attenuation of each transmission line segment 120 of the phase shifter 100 may be independently controlled, enabling independent control of the phase and attenuation of the phase shifter 100 over a wide range.

By taking advantage of the distributed structure of the phase shifter 100 to build-in a small attenuation step in each unit segment 120, the phase shifter 100 is able to function as a digitally-controlled attenuator with excellent linearity and minimal impact on $S_{11}$. As the attenuator is integrated into the phase shifter 100, there is no additional area overhead and minimal insertion loss when compared with a conventional attenuator. By implementing an attenuator as a distributed structure with many unit segments, the attenuation per unit cell 120 can be small, thereby minimizing dispersion.

FIGS. 4A to 4D schematically illustrate a single segment 220 of a transmission line phase shifter in the form of a coplanar waveguide phase shifter in accordance with an embodiment of the present disclosure. The transmission line phase shifter comprises a plurality of the transmission line segments 220 coupled in series, each independently controllable to selectively attenuate and/or phase shift a signal propagating along the transmission line. FIGS. 4A to 4D illustrate the transmission line segment 220 in the following four configurations: A) phase shift off (low), attenuation off (low); B) phase shift on (high), attenuation off (low); C) phase shift off (low), attenuation on (high); and D) phase shift on (high), attenuation on (high).

With reference to FIGS. 4A to 4D, the transmission line segment 220 comprises a coplanar waveguide comprising a central conductor 222, a pair of inner conductors 224, parallel to the central conductor 222 and arranged on opposite sides of the central conductor 222, and a pair of outer conductors 226 parallel to the central conductor 222 and arranged on opposite sides of the central conductor 222. A spacing of the outer conductors 226 from the central conductor 222 is greater than a spacing of the inner conductors 224 from the central conductor 222. The central conductor 222 forms the signal line or signal path. The inner conductors 224 are selectively couplable to a ground potential, for example a ground plane (not shown), via respective switches S0 to provide an inner return path. The outer conductors 226 are coupled directly to the ground potential to provide an outer return path.

The transmission line segment 220 further comprises an attenuation circuit 230 selectively couplable between the central conductor 222 and the ground potential for selectively attenuating a signal propagating through the transmission line segment 220. The transmission line segment 220 further comprises a first capacitance C1 selectively couplable between the central conductor 222 and the ground potential for compensating a capacitance of the attenuation circuit 230.

Figure 4A:
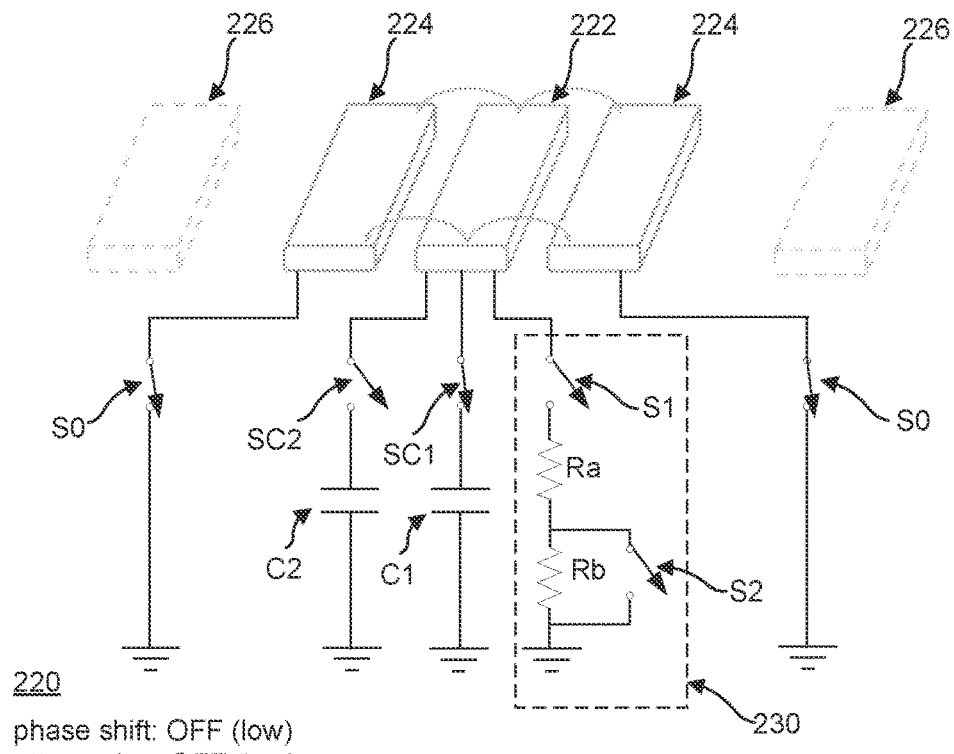
Figure 4B:
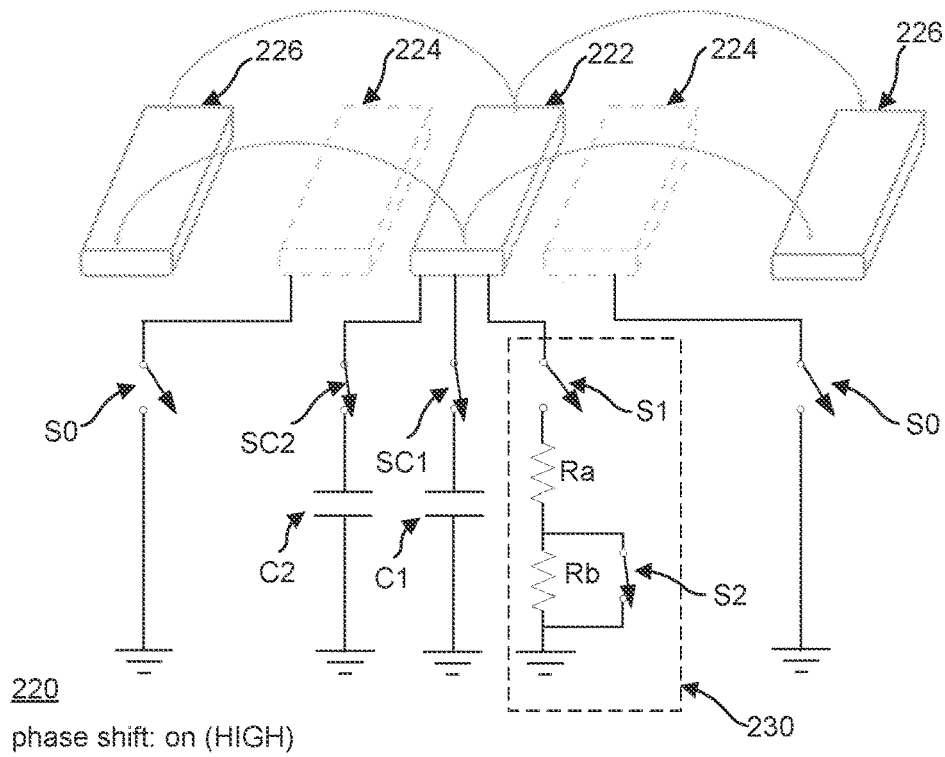
Figure 4C:
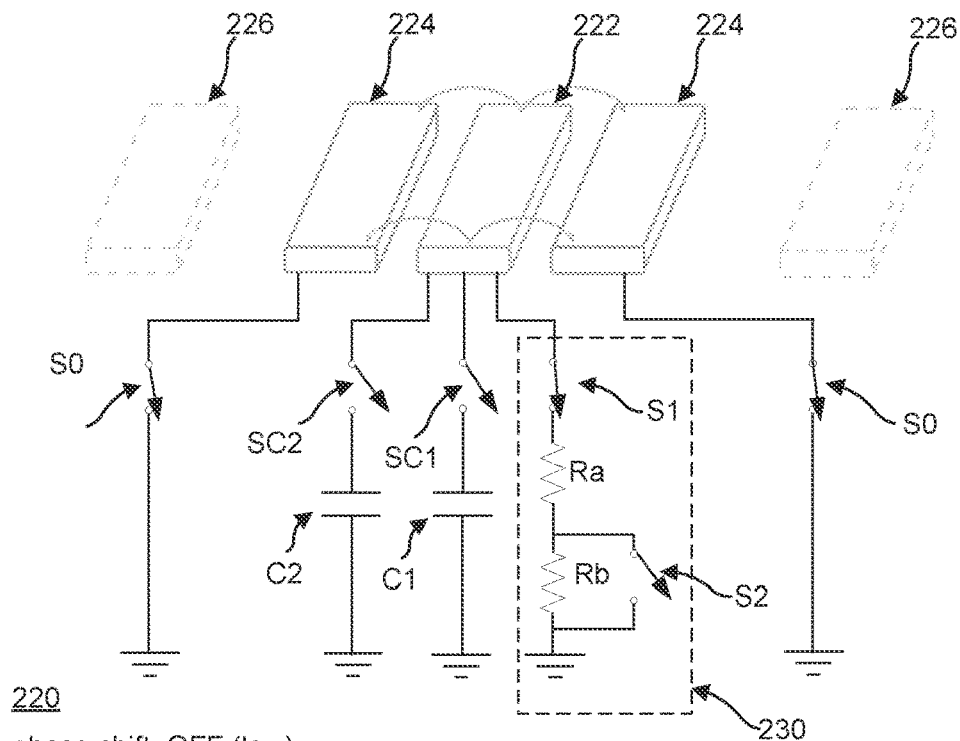
Figure 4D:
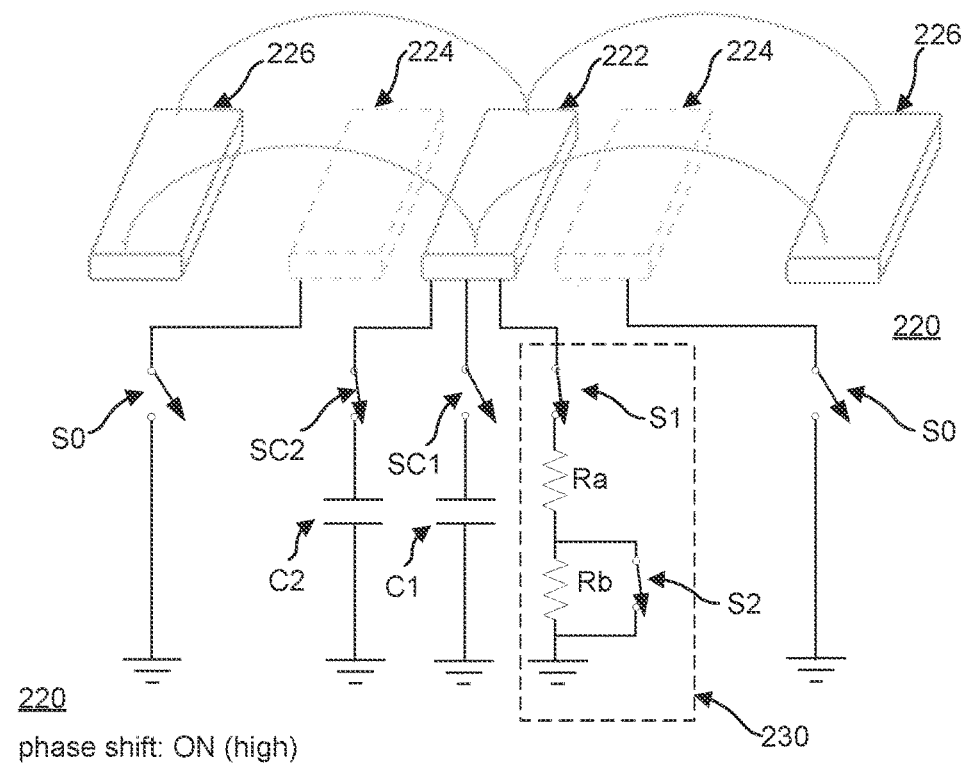

The effective inductance of the transmission line segment 220 increases with the area between the central conductor 222 and the ground return path. Therefore, by controlling the switches S0 between non-conducting and conducting states, the inductance and therefore the delay or phase shift provided by the transmission line segment 220 is changed. In a first configuration, as shown in FIGS. 4A and 4C, the two switches S0 are conducting (closed) to couple the inner conductors 224 to ground, such that the ground return path is provided by the inner conductors 224 and the transmission line segment 220 provides a first (low) phase shift for a signal propagating through the transmission line segment. In a second configuration, as shown in FIGS. 4B and 4D, the two switches S0 are non-conducting (open) such that the ground return path is provided by the outer conductors 226 and the transmission line segment 220 provides a second (high) phase shift, greater than said first phase shift, for a signal propagating through the transmission line segment 220.

To minimise any change in impedance when the phase shift is switched between the OFF (low) and ON (high) states, the transmission line segment 220 further comprises a second capacitance selectively couplable between the central conductor 222 and the ground potential. In this embodiment, the second capacitance is provided by a capacitor C2 connected on one side to ground and on the other side via a switch SC2 to the central conductor 222. The characteristic impedance of the transmission line segment 220 is $Z_0=\sqrt{(L/C)}$ where L and C are the respective inductance and capacitance of the transmission line segment 220. Typically, a value $Z_0=50\Omega$ is used, which is set by the width of the central conductor 222 together with the spacing to the inner ground return path 224. The phase shift or delay of a signal propagating through the transmission line segment 220 is $\Delta\Phi=\sqrt{(L \cdot C)}$. To switch the phase delay ON (high), the inner return path 224 is switched off by controlling the switches SO to their non-conducting states, thereby increasing L. To avoid simultaneously increasing the value of $Z_0$, the capacitance C of the transmission line segment 220 is increased by coupling the second capacitance C2 between the central conductor 222 and the ground potential by closing switch SC2.

That is, when the phase shift of the transmission line segment 220 is OFF (low), as shown in FIGS. 4A and 4C, switches SO are closed and switch SC2 is open or non-conducting. On the other hand, when the phase shift of the transmission line segment 220 is ON (high), as shown in FIGS. 4B and 4D, switches SO are open to increase the inductance of the transmission line segment 220 and switch SC2 is closed to simultaneously increase the capacitance of the transmission line segment 220.

The attenuation circuit 230 comprises a first switching element 51, for selectively coupling the attenuation circuit 230 between the central conductor 222 and the ground plane. The attenuation circuit further comprises resistances Ra and Rb connected in series with the first switching element 51. In this embodiment, the first switching element 51 and one resistance Ra are provided in the form of an integrated circuit switch, for example a transistor, with the resistance Ra corresponding to the internal resistance of the switch. The resistance Rb may be provided by a resistor. A second switching element S2 is coupled in parallel with the resistance Rb for optionally bypassing the resistance Rb.

Thus the attenuation circuit 230, when coupled between the central conductor 222 and ground plane by closing the first switching element 51, provides a resistive loss path to ground. As a result, a signal propagating through the transmission line segment 220 is attenuated more strongly when the switch S1 is closed or conducting (i.e. attenuation ON) than when switch S1 is open or non-conducting (i.e. attenuation OFF). The attenuation factor obtained by switching the attenuation ON (high) is approximately $A=20 \log (1+50/R)$ where R is the resistance provided the attenuation circuit 230 between the central conductor 222 and ground. This equation is valid for small R, and therefore holds in this case because the attenuation is obtained by a plurality of small attenuation steps, such that the attenuation per unit segment 220 is small.

However, differences in losses introduced by the switches S0 when the phase shift is OFF (low) and the switch SC2 when the phase shift is ON (high), result in an increased loss when the phase shift is ON (high). To compensate for this Phase-to-Gain, the switch S2 of the attenuation circuit 230 is closed to bypass the resistance Rb when the phase shift is ON (at least when the attenuation is also ON), thereby reducing the attenuation by the attenuation circuit 230. That is, the attenuation circuit 230 is selectively configurable between a first configuration providing a first resistance $R=Ra+Rb$ between the central conductor 220 and ground and a second configuration providing a second resistance $R=Ra$, smaller than the first resistance, between the central conductor 220 and ground. In the first configuration, switch S2 is open. In the second configuration, switch S2 is closed. If the phase shift is OFF, then when the attenuation is ON, switch S2 is open and the attenuation circuit 230 provides the first resistance $R=Ra+Rb$ to ground. If the phase shift is ON, then when the attenuation is ON the attenuation circuit 230 provides the second resistance $R=Ra$ to ground. The values of Ra and Rb are selected so keep the attenuation A provided by the attenuation circuit 230 when the attenuation is ON (switch S1 closed) as constant as possible while the phase shift is switched between ON or OFF states. It is noted that in other embodiments, losses elsewhere in the transmission line segment 220 (e.g. switches S0 and SC2 as discussed above) may be lower when the phase shift is ON, in which case the attenuation provided by the attenuation circuit 230 would need to be higher when the phase shift is ON. Also, other embodiments may use a different arrangement to provide the first and second values of resistance, for example, two separate switches, each switching a single resistance. However, the present arrangement benefits from a lower insertion loss.

Furthermore, switching the attenuation of the transmission line segment 220 ON (high), by switching in the attenuation circuit 230 via switching element S1, introduces additional capacitance in the transmission line segment 220. In order to compensate for this additional capacitance (Gain-to-Phase), a first capacitance C1 is selectively coupled between the central conductor 222 and ground when the attenuation is OFF (i.e. switch S1 open), by closing switching element SC1. When the value of the capacitance C1 is set correctly, the phase shift provided by the transmission line segment 220 remains constant when switching the attenuation ON and OFF.

FIG. 4A illustrates the transmission line segment 220 configured such that the phase shift is OFF (low) (that is, switches S0 are closed and switch SC2 is open) and the attenuation is OFF (low) (that is, switch S1 is open, switch SC1 is closed; switch S2 may be open or closed but is shown open because the phase shift is OFF).

FIG. 4B illustrates the transmission line segment 220 configured such that the phase shift is ON (high), (that is, switches S0 are open and switch SC2 is closed) and the attenuation is still OFF (low) (that is, switch S1 is open, switch SC1 is closed; switch S2 may be open or closed but is shown closed because the phase shift is ON).

FIG. 4C illustrates the transmission line segment 220 configured such that the phase shift is OFF (low) (that is, switches S0 are closed and switch SC2 is open) and the attenuation is ON (high) (that is, switch S1 is closed, switch SC1 is open, switch S2 is open).

FIG. 4D illustrates the transmission line segment 220 configured such that the phase shift is ON (high), (that is, switches S0 are open and switch SC2 is closed) and the attenuation is also ON (high) (that is, switch S1 is closed, switch SC1 is open, switch S2 is closed).

The phase shifter illustrated in FIGS. 4A to 4B may be implemented on an integrated chip. The central conductor 222, inner conductors 224 and outer conductors 226 may be formed using metallization on the substrate. A ground plane in the form of a metal shield layer may be provided in a lower layer under the conductors 222, 224, 226. The switching elements S0, S1, S2, SC1 and SC2 may be implemented using any type of switch, for example, MOS, pin diode, Schottky diode, etc. The switches may be located between the respective layers of the conductors 222, 224, 226 and the metal shield. The capacitances C1, C2 and the resistance Rb may be located below the metal shield. As mentioned previously, the resistance Ra may correspond to the internal resistance of switching element 51 of the attenuation circuit 230, although a separate resistance may be provided if preferred. Integrating an attenuator into a transmission line phase shifter as described in the present disclosure does not lead to any increase in area overhead (footprint) as the additional components (switches, capacitances, resistances) are located within the footprint of the transmission line segments.

The phase shifter of the present disclosure may be directly controlled using a digital controller. Separate digital control logic may be used to control each of the phase shift and the attenuation of the phase shifter. For example, a digital code may be used to represent the number of transmission line segments 220 for which the phase shift is ON (high), and another digital code may be used to represent the number of transmission line segments 220 for which the attenuation is ON (high). The digital controller receives the digital code specifying the required overall attenuation and/or phase shift of the phase shifter and outputs control signals to the switches of each transmission line segment 220 to control the attenuation and/or phase shift of each transmission line segment 220 accordingly.

For each transmission line segment 220, the switches S0, S1, S2, SC1 and SC2 may be controlled open or closed depending on the respective phase shift and attenuation states (i.e. phase shift OFF, attenuation OFF; phase shift ON, attenuation OFF; phase shift OFF, attenuation ON; or phase shift ON, attenuation ON) input to the digital controller for the respective transmission line segment 220 as shown in FIGS. 4A to 4D. This ensures compensation of Phase-to-Gain and Gain-to-Phase for each individual transmission line segment 220. In alternative embodiments for which sufficient on-chip memory is provided, look-up tables may be provided storing all possible phase and attenuation states. This could reduce the complexity of the phase shifter by enabling omission of some of the switches (e.g. S2, SC2) used for compensation of Phase-to-Gain and Gain-to-Phase, thereby reducing insertion losses. For example, when switching the attenuation state for one transmission line segment 220, gain-to-phase could be compensated by simultaneously switching the phase shift state of one or more of the transmission line segments to maintain a constant phase shift for the overall phase shifter.

A phase shifter comprising thirty of the transmission line segments 220 connected in series was implemented, with built-in attenuation, Gain-to-Phase compensation and Phase-to-Gain compensation as described above in connection with FIGS. 4A to 4D. Based on simulation results, the phase shifter has a phase shift range of 99.8 degrees when the attenuation is switched OFF in all segments 220, and a phase shift range of 99.5 degrees when the attenuation is switched ON in all segments 220. In each case, the overall phase shift increases linearly as the phase shift is switched ON in successive segments 220. In addition, the phase shifter has an attenuation step of 0.463 dB per segment when the phase shift is switched OFF in all segments 220, and an attenuation step of 0.499 dB when the phase shift is switched ON in all segments 220. The attenuation increases linearly as the attenuation is switched ON in successive segments 220. It has therefore been demonstrated that the phase shifter according to the present disclosure can function as a linear attenuator without compromising the performance of the phase shifting function of the phase shifter. Similarly, the phase shifter can function as a linear phase shifter without compromising the attenuation function of the phase shifter. The implementation disclosed above using 30 segments has a phase shift range of around 100 degrees and an attenuation range of around 15 dB, but can be extended to any phase shift and attenuation range by increasing the number of segments. The minimum step size of the phase shift and attenuation can also be selected through the design parameters of the individual segments.

Figure 5:
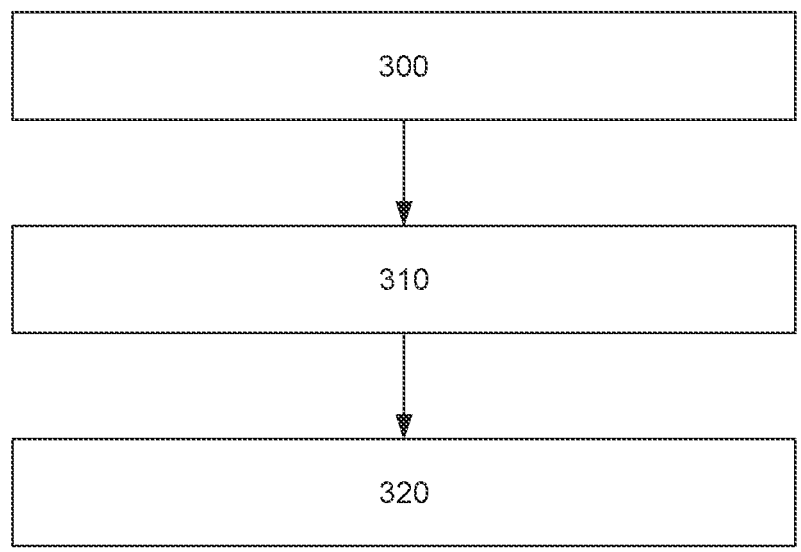
FIG. 5 is a flow diagram illustrating a method according to an example embodiment of the invention.

FIG. 5 illustrates a method for controlling an attenuation of a phase shifter such as that shown in FIG. 3 or FIGS. 4A to 4D.

At a step 300, for each transmission line segment 120, 220 of the plurality of transmission line segments, either a first configuration of the transmission line segment, providing a first phase shift for a signal propagating along the signal line 126, 222, or a second configuration of the transmission line segment, providing a second phase shift for the signal, is selected. The second phase shift is greater than the first phase shift. In the embodiment shown in FIGS. 4A to 4D, this is achieved by controlling the two switches S0, for example by a control signal from a digital controller. The switches S0 are controlled to a closed (conducting) state if the first phase shift is selected (as shown in FIGS. 4A and 4C), or to an open (non-conducting) state if the second phase shift is selected (as shown in FIGS. 4B and 4D).

At a step 310, for each transmission line segment 120, 220 of the plurality of transmission line segments, an attenuation circuit 130, 230 is selectively coupled between a signal line 126, 222 of at least one transmission line segment 120, 220 and ground to selectively attenuate a signal propagating through the transmission line segment 120, 220. This is achieved by controlling the switch 134 in the embodiment of FIG. 3, and by controlling the switch S1 in the embodiment shown in FIGS. 4A to 4D. The respective switch 134, 51 is controlled, for example by a control signal from a digital controller, to a closed (conducting) state if it is selected that the attenuation circuit 230, 330 is coupled for attenuating the signal at the respective transmission line segment 120, 220, as shown in FIGS. 4C and 4D. Otherwise, the respective switch 134, 51 is controlled to an open (non-conducting state) if no additional attenuation is required for the respective transmission line segment 120, 220, as shown in FIGS. 4A and 4B.

At a step 320, for each transmission line segment 120, 220 of the plurality of transmission line segments, either a first configuration of the attenuation circuit 230 providing a first resistance between the signal line 222 and ground, or a second configuration of the attenuation circuit 230 providing a second resistance between the signal line 222 and ground, is selected. The second resistance is different from said first resistance. In the embodiment shown in FIGS. 4A to 4D, this is achieved by controlling the second switch S2, for example by a control signal from a digital controller. When the attenuation circuit 130, 230 is coupled between the signal line 126, 222 and ground by closing the first switch S1 for a respective transmission line segment 120, 220, then the switch S2 is controlled to an open (non-conducting) state if the first phase shift is selected, as shown in FIG. 4C, or to a closed (conducting) state if the second phase shift is selected, as shown in FIG. 4D.

Although particular example embodiments of the disclosure have been described above, it will be appreciated than many modifications, including additions and/or substitutions, may be made within the scope of the appended claims.

The invention claimed is:

1. A phase shifter comprising:
  a plurality of transmission line segments coupled in series, wherein each said transmission line segment is switchable between a first configuration providing a first phase shift for a signal propagating through the transmission line segment and a second configuration providing a second phase shift, greater than said first phase shift, for a signal propagating through the transmission line segment; wherein each said transmission line segment comprises:
    an attenuation circuit selectively couplable between a signal line of the transmission line segment and ground to selectively attenuate the signal propagating through the transmission line segment, wherein the attenuation circuit is selectively configurable between:
      a first configuration providing a first resistance between the signal line and ground, when the attenuation circuit is coupled between the signal line and ground, and
      a second configuration providing a second resistance between the signal line and ground when the attenuation circuit is coupled between the signal line and ground, wherein said second resistance is different from said first resistance; and
  wherein said phase shifter is configured such that
    said first configuration of said attenuation circuit is selected when the attenuation circuit is coupled between the signal line and ground and said transmission line segment is configured for providing said first phase shift; and
    said second configuration of said attenuation circuit is selected when the attenuation circuit is coupled between the signal line and ground and said transmission line segment is configured for providing said second phase shift.

2. A phase shifter according to claim 1, wherein the attenuation circuit comprises:
a first switching element for selectively coupling the attenuation circuit between the signal line and ground; and
a second switching element for selectively bypassing a resistive element in the attenuation circuit thereby providing one of the first resistance or the second resistance between the signal line and ground.

3. A phase shifter according to claim 1,
wherein each said transmission line segment comprises a first capacitance selectively couplable between a signal line of the transmission line segment and ground for compensating a capacitance of the attenuation circuit.

4. A phase shifter according to claim 3, wherein said phase shifter is configured such that said first capacitance is coupled between the signal line and ground when the attenuation circuit is not coupled between the signal line and ground.

5. A phase shifter according to claim 1, wherein each said transmission line segment comprises a second capacitance selectively couplable between a signal line of the transmission line segment and ground to avoid increasing a characteristic impedance of the transmission line segment when the transmission line segment is switched from the first configuration of the transmission line segment to the second configuration of the transmission line segment.

6. A phase shifter according to claim 1, wherein each said transmission line segment is a segment of a coplanar waveguide transmission line and comprises:
a central conductor providing at least a portion of said signal line;
first and second inner conductors parallel to the central conductor, and arranged on opposite sides of the central conductor, selectively couplable to ground to provide an inner return path; and
first and second outer conductors parallel to the central conductor and arranged on opposite sides of the central conductor, providing an outer return path, wherein a spacing of said first and second outer conductors from the central conductor is greater than a spacing of said first and second inner conductors from the central conductor;
wherein, in said first configuration of said transmission line segment, said inner conductors are coupled to ground, providing said first phase shift for a signal propagating through the transmission line segment; and
wherein, in said second configuration of said transmission line segment, said inner conductors are not coupled to ground, wherein said outer conductors are coupled to ground, providing a second phase shift, greater than said first phase shift, for a signal propagating through the transmission line segment.

7. A phase shifter according to claim 1, further comprising a controller configured to receive an input specifying a required attenuation of the phase shifter, and further configured to output at least one control signal for each transmission line segment of the phase shifter, for controlling said selective coupling of each respective attenuation circuit in dependence on the required attenuation.

8. A phase shifter according to claim 7, further comprising memory storing a plurality of attenuation states and/or phase states of the phase shifter in association with a plurality of corresponding states of the attenuation circuits of the respective transmission line segments and/or configurations of the respective transmission line segments, wherein the controller is configured, in response to receiving a required attenuation, to determine the corresponding states of the attenuation circuits by reference to said memory, and to output said control signals in accordance with the determination.

9. A method for controlling an attenuation of a phase shifter, the phase shifter comprising a plurality of transmission line segments coupled in series, the method comprising:
for each transmission line segment of the plurality of transmission line segments, selectively coupling an attenuation circuit between a signal line of the transmission line segment and ground to selectively attenuate a signal propagating through the transmission line segment;
for each transmission line segment of the plurality of transmission line segments, selecting between a first configuration of the transmission line segment providing a first phase shift for the signal and a second configuration of the transmission line segment providing a second phase shift for the signal, greater than said first phase shift; and
for each transmission line segment of the plurality of transmission line segments, selecting between a first configuration of the attenuation circuit providing a first resistance between the signal line and ground, when the attenuation circuit is coupled between the signal line and ground, and a second configuration of the attenuation circuit providing a second resistance, different from said first resistance, between the signal line and ground, when the attenuation circuit is coupled between the signal line and ground; and
wherein said phase shifter is configured such that
said first configuration of said attenuation circuit is selected when the attenuation circuit is coupled between the signal line and ground and said transmission line segment is configured for providing said first phase shift; and
said second configuration of said attenuation circuit is selected when the attenuation circuit is coupled between the signal line and ground and said transmission line segment is configured for providing said second phase shift.

10. A method according to claim 9, further comprising:
for each transmission line segment of the plurality of transmission line segments, selecting between a first configuration of the attenuation circuit providing a first resistance between the signal line and ground and a second configuration of the attenuation circuit providing a second resistance, greater than said first resistance, between the signal line and ground.

11. A phase shifter according to claim 3, wherein each said transmission line segment comprises a second capacitance selectively coupled between the signal line of the transmission line segment and ground for compensating a difference in capacitance to avoid increasing a characteristic impedance of the transmission line segment between the first configuration of the transmission line segment and the second configuration of the transmission line segment.

12. A phase shifter according to claim 3, wherein each said transmission line segment is a segment of a coplanar waveguide transmission line and comprises:
a central conductor providing at least a portion of said signal line;

first and second inner conductors parallel to the central conductor, and arranged on opposite sides of the central conductor, selectively couplable to ground to provide an inner return path; and first and second outer conductors parallel to the central conductor and arranged on opposite sides of the central conductor, providing an outer return path, wherein a spacing of said first and second outer conductors from the central conductor is greater than a spacing of said first and second inner conductors from the central conductor;

wherein, in a first configuration of said transmission line segment, said inner conductors are coupled to ground, providing said first phase shift for a signal propagating through the transmission line segment; and wherein, in a second configuration of said transmission line segment, said inner conductors are not coupled to ground, wherein said outer conductors are coupled to ground, providing a second phase shift, greater than said first phase shift, for a signal propagating through the transmission line segment.

13. A phase shifter according to claim 3, further comprising a controller configured to receive an input specifying a required attenuation of the phase shifter, and further configured to output at least one control signal for each transmission line segment of the phase shifter, for controlling said selective coupling of the first capacitance of each respective attenuation circuit in dependence on the required attenuation, and further for controlling a switching element in the attenuation circuit for selectively bypassing a resistive element in the attenuation circuit thereby selectively providing one of the first resistance and the second resistance between the signal line and ground.

* * * * *